United States Patent [19]

Gibbons et al.

[11] Patent Number: 5,345,163
[45] Date of Patent: Sep. 6, 1994

[54] BATTERY MONITORING SYSTEM

[75] Inventors: Gerard P. Gibbons; Lyle V. Tabler, both of Calgary, Canada

[73] Assignee: Battery Master Inc., Calgary, Canada

[21] Appl. No.: 848,534

[22] Filed: Mar. 9, 1992

[30] Foreign Application Priority Data

Jun. 5, 1991 [CA] Canada ................. 2043959

[51] Int. Cl.⁵ .............................................. G08B 21/00
[52] U.S. Cl. ....................... 320/48; 324/430; 340/636
[58] Field of Search ............... 320/2, 48, 39; 324/430; 340/636

[56] References Cited

U.S. PATENT DOCUMENTS

| 3,932,797 | 1/1976 | York | 320/39 |
| 3,940,679 | 2/1976 | Brandwein et al. | 320/48 |
| 3,979,657 | 9/1976 | Yorksie | 320/48 X |
| 3,997,888 | 12/1976 | Kremer | 320/48 X |
| 4,024,523 | 5/1977 | Arnold et al. | 320/48 X |
| 4,803,459 | 2/1989 | Ta | 320/48 X |

Primary Examiner—R. J. Hickey
Attorney, Agent, or Firm—Larson & Taylor

[57] ABSTRACT

A battery monitoring method and apparatus are used for monitoring the charge level of a rechargeable electric storage battery, for example a lead acid battery. The counter-voltage of the battery is monitored by continuously monitoring the actual terminal voltage of the battery. When the battery is fully charged, the monitor provides a "DO NOT CHARGE" signal, for example a green light. When the charge level has dropped to a point that there may be some value in recharging the battery, the "DO NOT CHARGE" signal is replaced with an "OK TO CHARGE" signal, for example a yellow light. When the battery has discharged to the point where the battery must be recharged in order to avoid damage, the "OK TO CHARGE" signal is replaced with a "MUST CHARGE" signal, for example a red light. Audible signals may accompany the "OK TO CHARGE" and "MUST CHARGE" signals. The monitor is self-testing when turned on. It automatically recognizes the charge level of a battery to which it is connected. When used in association with, for example, a lift truck, the monitor may include a lift lock-out function that is engaged in response to the battery being discharged to the "MUST CHARGE" level.

19 Claims, 5 Drawing Sheets

BATTERY MONITORING SYSTEM

FIELD OF THE INVENTION

The present invention relates to battery monitors more particularly to a battery monitor for monitoring the charge on a rechargeable electric storage battery.

BACKGROUND

Rechargeable electric storage batteries, for example lead-acid batteries are used in industrial equipment such as lift trucks. In such use it is important to establish a battery maintenance strategy that provides for the most efficient use of the battery and the battery charger. A battery should be so sized and charged sufficiently that it will be ready for recharging at the end of a work period, for example a shift, with the discharge level being appropriate to satisfy the charger requirements. The battery maintenance strategy should also involve the use of an appropriate battery monitoring technique to ensure that charged batteries are not unnecessarily put on charge and to ensure the batteries are not discharged beyond an acceptable level.

With a lead-acid battery, charging an already charged battery, say with a specific gravity (SG) above 1.240, increases water consumption, damages the battery plates and removes up to one cycle from the potential life of the battery. On the other hand, battery manufacturers advise that discharging a battery below an SG of about 1.140 (80% of useable capacity) will damage the battery and cancel its warranty. In general terms, for every 10 points of SG maintained above the manufacturer's maximum discharge level, an extra year of battery life may be realized. Another factor to consider is the charger requirements, which generally dictate a minimum charge of SG 1.160 to 1.185. The optimum level for maximum battery discharge is considered to between SG 1.170 and 1.150. It is therefore an important part of a battery maintenance program to have an effective battery charge monitoring method and apparatus.

SUMMARY

According to one aspect of the present invention there is provided a method of monitoring the charge on an electric storage battery having two terminals with a counter-voltage across the terminals, said method comprising:

monitoring the counter-voltage of the battery;

producing a Do Not Charge signal when the counter-voltage of the battery exceeds a first predetermined voltage;

producing a OK To Charge signal when the counter-voltage of the battery is between the first predetermined voltage and a second predetermined voltage less than the first predetermined voltage; and producing a Must Charge signal when the counter-voltage of the battery is less than the second predetermined voltage.

The counter-voltage is the stable open terminal voltage of the battery, which varies with the battery charge.

By providing three separate signals indicating the three charge conditions of concern, the problems of interpretation inherent in using a analogue gauge are eliminated. The user is given specific, unmistakable signals defining the condition of the battery.

Also according to this aspect of the invention there is provided a battery monitor for a rechargeable electric storage battery having a parameter with a value that is variable with battery charge, said monitor comprising:

means for monitoring the value of the battery parameter;

first comparator means for comparing the monitored value of the battery parameter with a first predetermined value;

second comparator means for comparing the monitor value of the battery parameter with a second predetermined value less than the first predetermined value;

first indicator means coupled to the first comparator means for providing a Do Not Charge signal in response to the detection of a monitored value of the battery parameter greater than the first predetermined value;

second indicator means coupled to the first and second comparator means for displaying an OK To Charge signal in response to detection of a monitored value of the battery parameter less than the first predetermined value and greater than the second predetermined value; and third indicator means for providing a Must Charge signal in response to the detection of a monitored value of the battery parameter less than the second predetermined value.

It is convenient to monitor the actual battery terminal voltage to assess the battery charge. However, this voltage drops when power is being drawn from the battery and recovers when the load is removed. Consequently, this actual terminal voltage cannot be used directly as an accurate measure of the counter-voltage or of the battery charge. Consequently, the comparator outputs may go to two timers which in turn control the indicator signals. The timers are reset whenever the actual battery voltage rises above the comparator threshold, so that the next signal will not be engaged until the battery voltage has been below a threshold level for a set period of time.

The timer system also allows the discharge level to float between the ideal discharge level and the maximum discharge level according to workload requirements. In normal duty applications, the Must Charge signal will turn on at the ideal level for battery discharge. The normal duty discharge rate closely matches a known average rate and the time from initial actuation of the timer to signal production is known. The voltage at which the timer is activated can then be set to achieve the desired coordination between charge level and signal production. In extra heavy workload conditions, the faster discharge rate may discharge the battery down as far as the manufacturers recommended minimum discharge level. The final discharge level may thus float between these two limits.

The apparatus may also include a third comparator for detecting very low voltages indicating battery faults, and producing an undelayed battery fault signal. The combination of this low voltage battery fault signal and a Do Not Charge or an OK To Charge signal is a clear indication of a fault in the battery system that must be corrected. Overvoltage protection, along with an overvoltage signal may also be included.

Where the monitor is used with a lift truck or other suitable equipment, it may be equipped with a lockout for locking out the lifting or some other function at a set time after the Must Charge signal is produced. This provides time for the operator to complete any action under way at the time but prevents continued operation that would damage the battery.

According to another aspect of the present invention there is provided a method of self-testing a battery monitor having a plural indicator means responsive to the application of respective voltages of different magnitudes to produce respective battery signals, said method comprising applying a sensor voltage to the indicator means and varying the magnitude of the sensor voltage to actuate the indicator means sequentially.

This aspect of the invention also provides a battery monitor for an electric storage battery comprising:

battery condition monitor means;

electrical connection means for electrically connecting the battery condition monitor means to the battery for generating a battery condition signal representing the battery charge;

battery condition display means connected to the battery condition monitor means for receiving the battery signal, the display means including a plurality of indicator means having respective initial states, the respective indicator means being operable in response to different levels of the battery condition signal to produce respective indications of the battery charge condition;

means responsive to disengagement of the electrical connection means for electrically disconnecting the battery condition monitor means from the battery for returning each indicator means to its initial state;

means responsive to engagement of the electrical connection means for electrically connecting the battery condition monitor means to the battery for varying the signal level of the battery condition signal from a level representing minimum battery charge to a level representing full battery charge, thereby operating the indicator means in sequence until the indicator means produce a signal representing the actual battery charge.

The self diagnosis system operates every time a battery is connected to the monitor. It also provides an automatic level recognition capability, establishing the state of charge of the battery if not fully charged.

BRIEF DESCRIPTION OF THE DRAWINGS

In the accompanying drawings, which illustrate an exemplary embodiment of the present invention.

DETAILED DESCRIPTION

Figure 2:
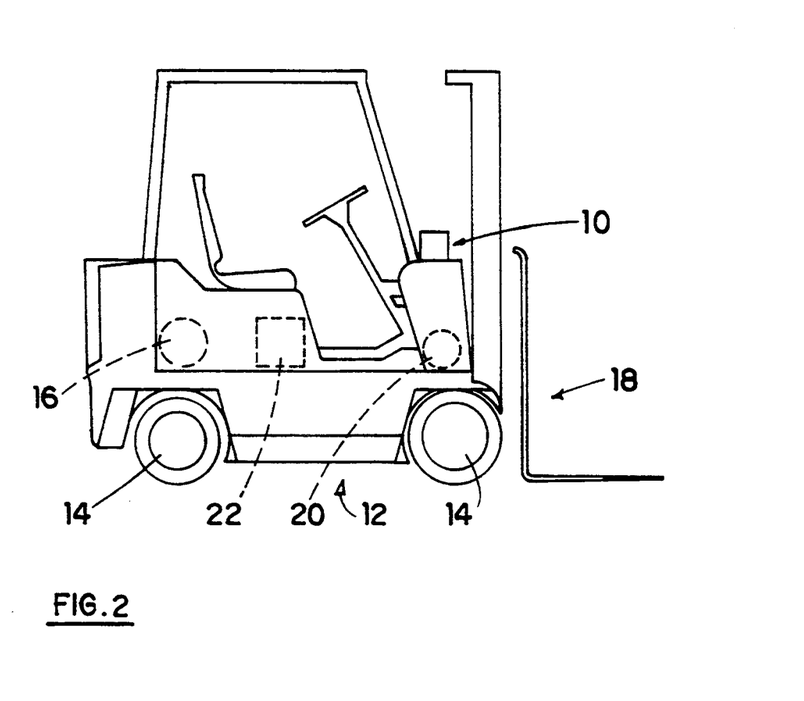
FIG. 2 is a somewhat schematic view of lift truck.
Figure 3A:
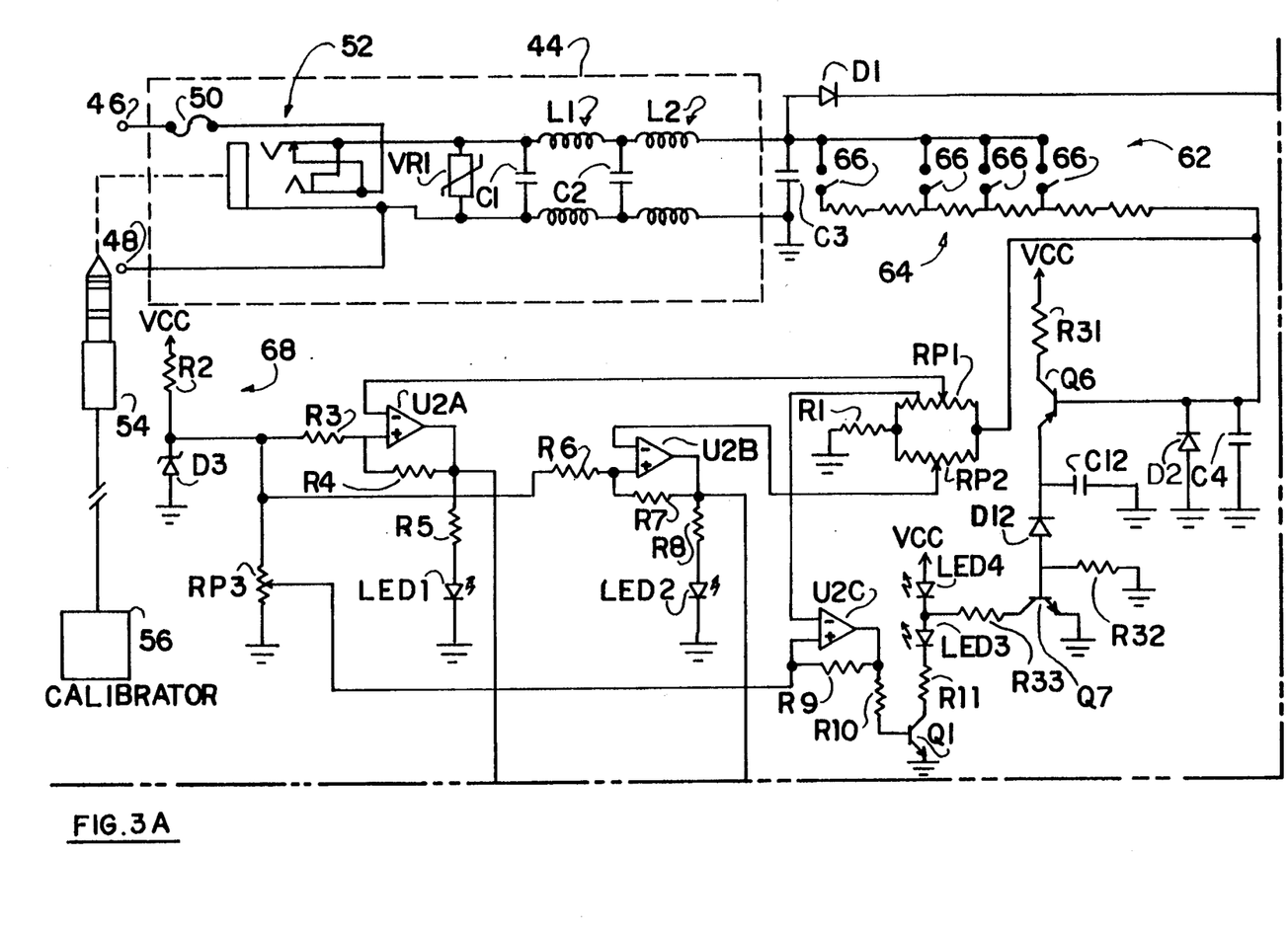
FIGS. 3A, 3B, 3C and 3D are sections of is a schematic view of the battery monitor system, and are to be viewed assembed according to FIG. 3E.
Figure 3B:
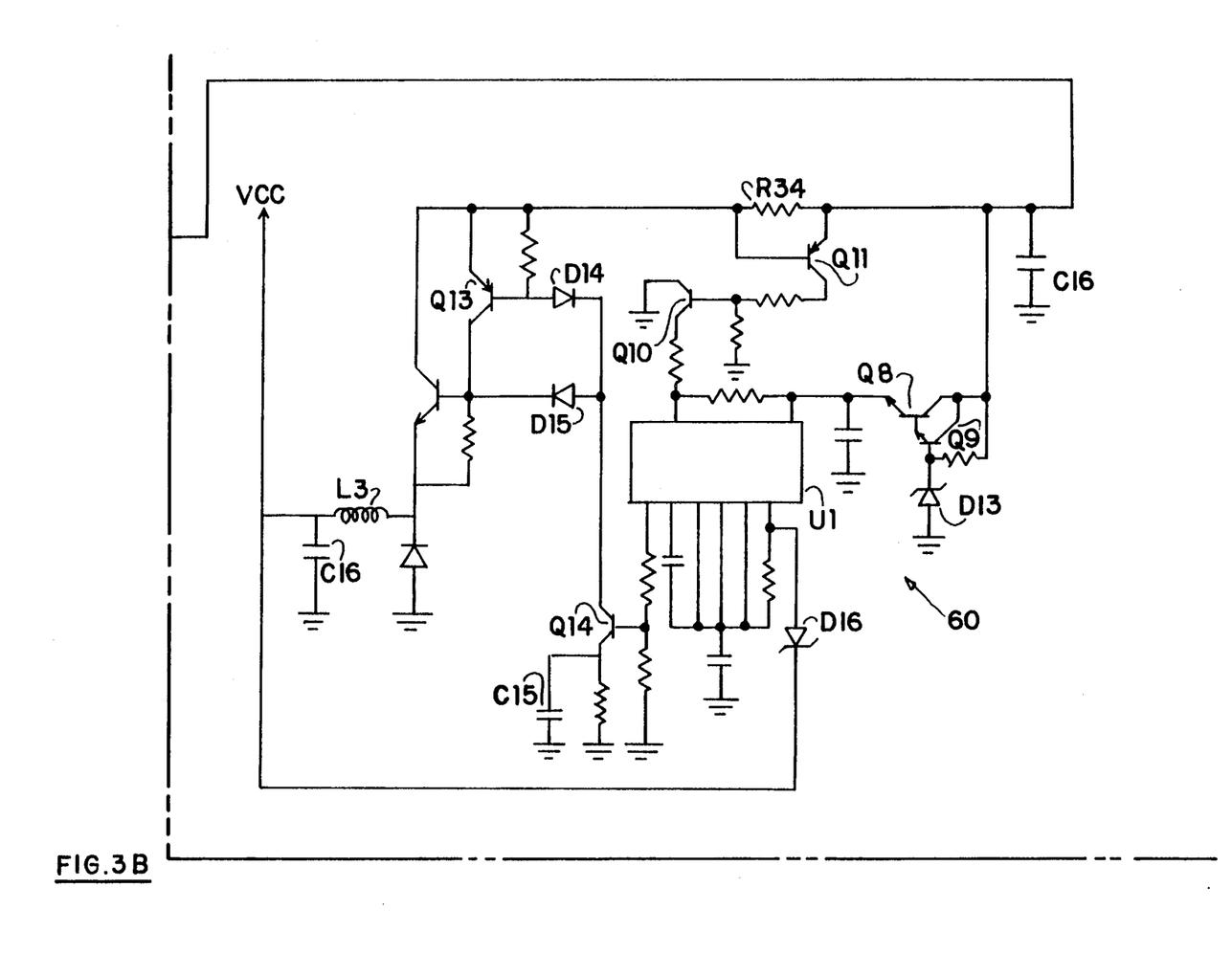
Figure 3C:
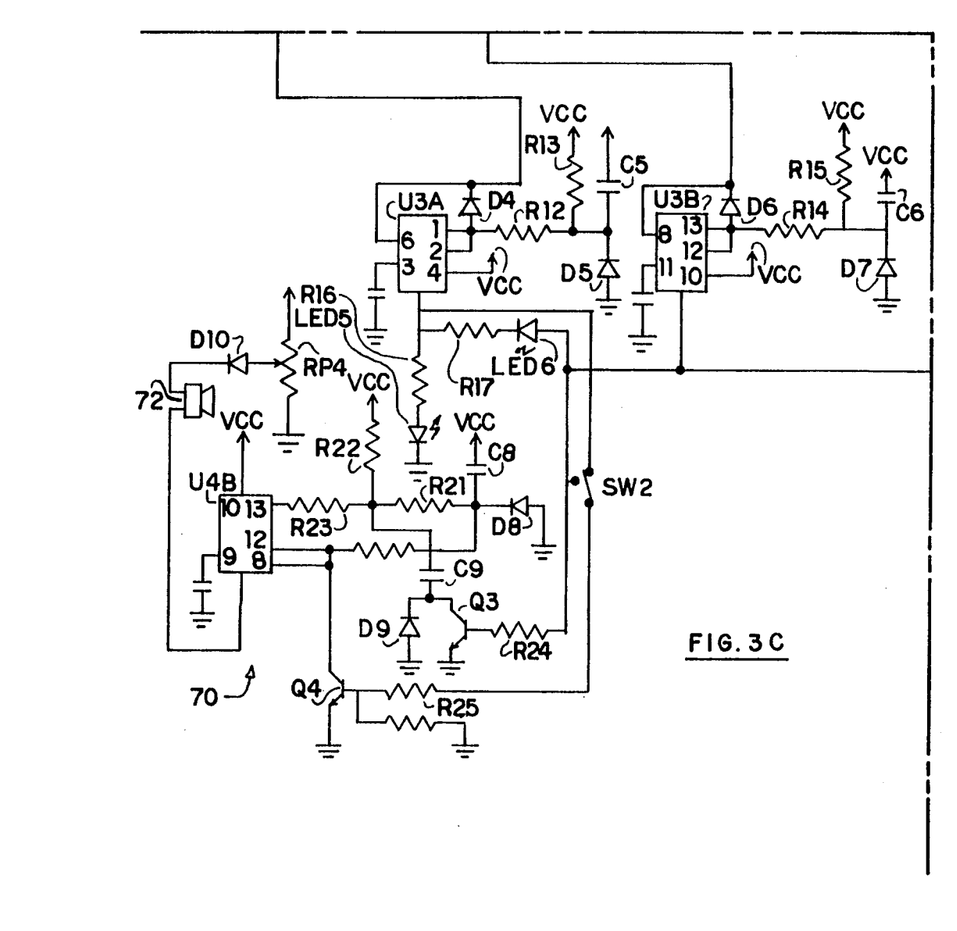
Figures 3D, 3E:
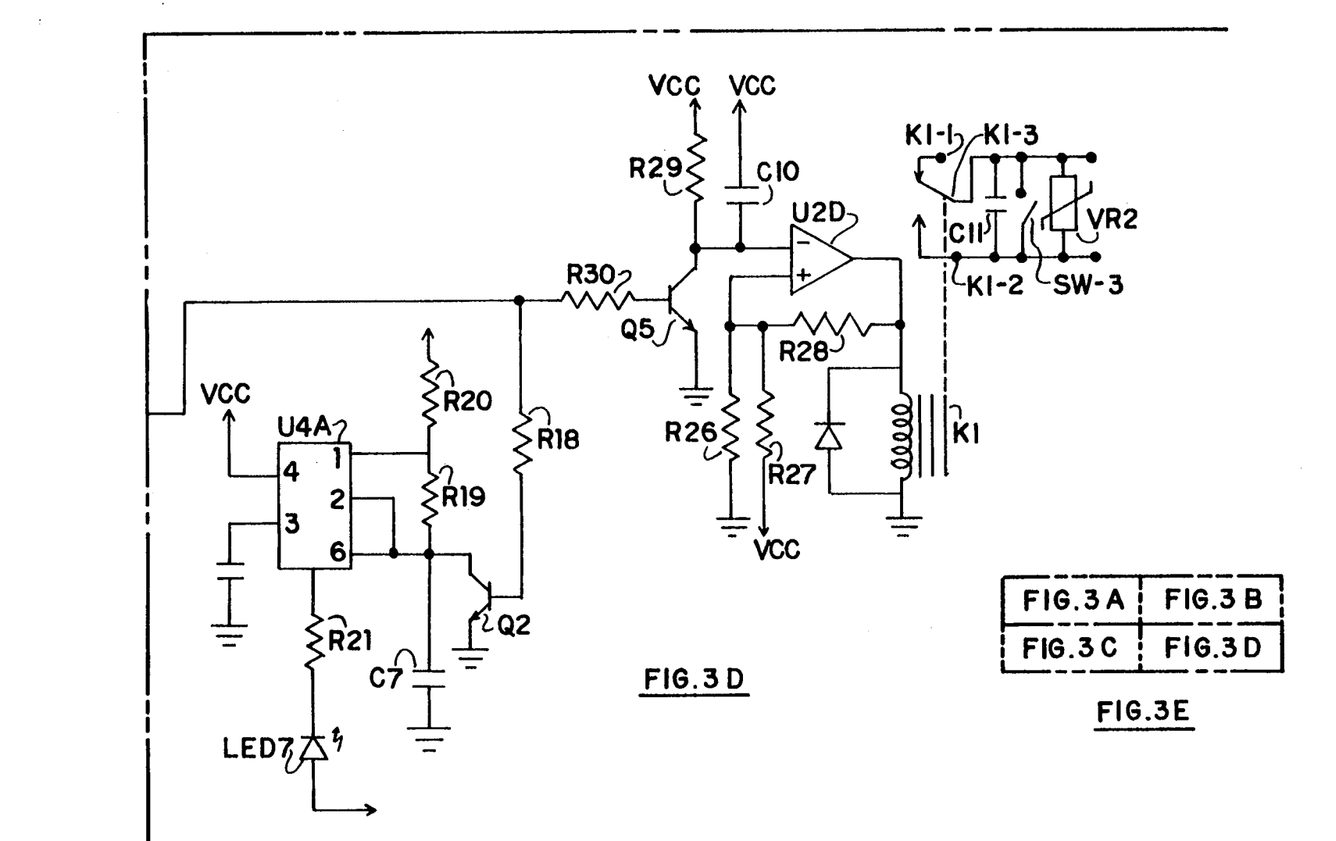

Referring to the accompanying drawings, FIG. 2 illustrates a battery monitor 10 mounted on a lift truck 12. The truck is carried on wheels 14, two of which are driven by a drive motor 16. The truck has a forklift 18 driven by a lift motor 20. Both the drive motor and the lift motor derive power from a battery 22.

Figure 1:
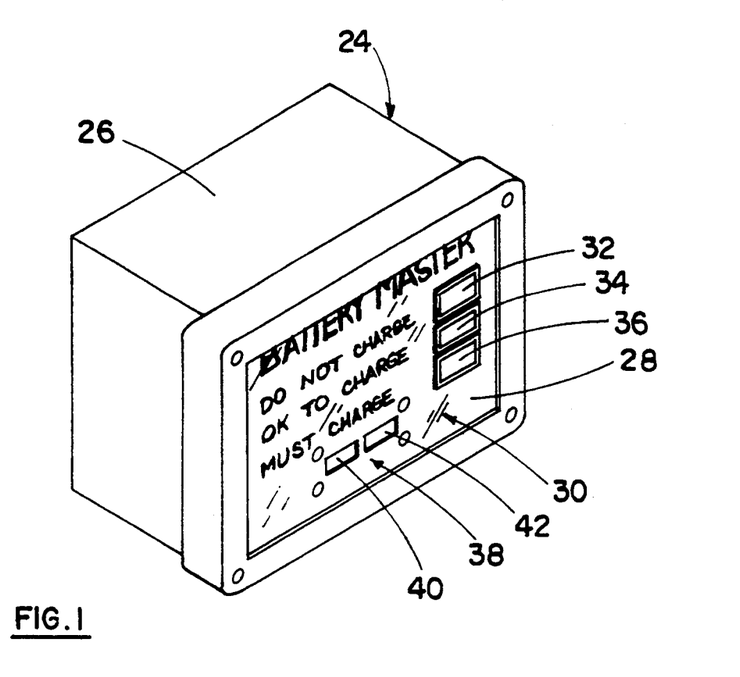
FIG. 1 is an isometric view of a battery monitor.

The monitor is most clearly illustrated in FIGS. 1 and 3A to 3D. As shown in FIG. 1, it includes a housing 24 with a casing 26 and a front window 28. A display 30 is visible through the front window. This display includes a Do Not Charge indicator 32 in the form of a green light emitting diode (LED) accompanied by the legend "Do Not Charge". A second indicator 34 is a yellow color LED associated with the legend "OK To Charge". A third indicator 36 is a red LED accompanied by the legend "Must Charge". The remaining indicator of the display is a battery fault indicator 38 which has two parts 40 and 42, both of which illuminate to indicate an undervoltage battery fault. The single indicator 42 lights to indicate an overvoltage fault.

An operator of a unit equipped with the monitor may immediately determine from the illuminated indicator the status of the battery. With the green Do Not Charge light lit, the battery is fully charged and ready for a full schedule of work before being recharged. The battery may be recharged when its normally scheduled duty has been completed. This duty is scheduled to coincide with the battery reaching the Must Charge state, although the battery monitor may still display the OK To Charge signal.

In the illustrated embodiment ten minutes after the Must Charge light is illuminated, a lift lockout is engaged, which disconnects the electric circuit to the lift motor 20. This period allows an operator to complete any lifting operations that are underway when the light comes on but prevents any further work until the battery has been recharged.

The yellow OK To Charge light is accompanied by an audible reminder signal, a soft pitched beep of one half second in duration repeated once every 5 minutes. This infrequent soft alarm is intended to inform and not annoy. It has proven especially effective in operations where there is no equipment supervision or technical know how. When the red Must Charge light is illuminated, the operator will hear the same tone beep of one half second in duration but occurring once every 4 seconds. This is considered an alarm indicating that the battery has reached maximum discharge level. Continued use in this range will cancel the manufacturer's warranty on the battery, decrease battery life and damage electrical components of the truck.

The operating schematic for the monitor is illustrated in FIGS. 3A to 3D. Power is supplied to an input circuit 44 through a battery positive terminal 46 and a battery negative terminal 48. The terminal 46 is connected to a slow blow fuse 50 for overvoltage protection as described more fully in the following. The terminals 46 and 48 are also connected to a jack 52 that receives a tip-ring-sleeve jack 54 connected to a calibrator 56. When the jack is inserted in, the power path from positive terminal 46 is broken and routed through the calibrator. The calibrator has the ability to simulate various battery specific gravity levels.

Excessively high overvoltages can be generated by emergency disconnect of the power from the battery. Transients of several hundred volts and several hundred amps lasting for several hundred milliseconds can be generated by magnetic fields in motors and relays. Transients can also be produced if the battery charger is inadvertently connected to the truck. A voltage regulator VR1 engages the terminals 46 and 48 and clamps the voltages to a safe level. The fuse 50 will blow out if the transient has sufficient energy.

The input circuit 44 also includes a filter consisting of a capacitor C1, a transformers L1, a capacitor C2, a transformer L2 and a capacitor C3. The filter is designed to eliminate electric motor and switching transients. The transformer L1 is used to reject differential mode transients, while the transformer L2 rejects common mode transients. The filter eliminates frequency components above 10 KHz which is bothersome to the rest of the circuitry. From the filter, power is supplied through a diode D1 to a switching regulator 60 and to a voltage selector 62. The selector 62 consists of a voltage divider 64 and four switches 66 for selecting an input voltage for the system. This allows the monitor to be used as a multi voltage unit. The output of the voltage selector 62 is filtered by a capacitor C4 to handle lower frequency components than those eliminated with the filter.

In the event that the battery is inadvertently connected in the reverse polarity, reverse bias protection is provided by diodes D1 and D2. Diode D1 prevents current flow to the regulator. Diode D2 will be forward biased and voltage limited to less than one volt. Current will be limited by the resistors of the voltage divider 64.

Power is supplied from the output of voltage selectors 62 to two trimpots RP1 and RP2 connected in parallel and connected to ground through a common resistor R1. The wipers of the two trimpots are connected to two comparators U2A and U2B. Reference voltage to the two comparators is provided from voltage reference 68, including diode D3 connected in series with resistor R2 between ground and a regulated voltage supply Vcc from the switching regulator 60. The diode D3 is 6.2 volt temperature compensated reference diode.

The reference voltage is supplied to the positive terminal of comparator U2A through a resistor R3. A feedback resistor R4 provides a small amount of hysteresis. The output from the comparator goes to a resistor R5 and from the resistor to a yellow light emitting diode LED1.

The comparator U2B is likewise connected to the voltage reference through a resistor R6, with a resistor R7 providing hysteresis. The output leads through a resistor R8 to a red light emitting diode LED2.

If the battery voltage is in the "OK To Charge" range, the voltage at the RP1 wiper will be below the threshold of comparator U2A and the output of the comparator will be high. Yellow LED1 will then be on. U2B operates in a similar fashion with respect to the red LED.

A third comparator U2C has its reference terminal connected to a trimpot RP3 connected between ground and the output of the voltage reference 68. The resistor R9 provides hysteresis. The other input to the comparator is from between the trimpots RP1 and RP2 and resistor R1.

The output of comparator U2C goes through resistor R10 to the base of transistor Q1. The transistor emitter is grounded and the collector is connected through a resistor R11 to two series connected red light emitting diodes LED3 and LED4. The LED's are in turn connected to regulated supply Vcc. The comparator U2C acts as a battery fault monitor. Its reference voltage is lower than that of U2B, although it is variable and can be set using RP3. When the U2C output is high, the transistor Q1 will be on, which turns on both LED3 and LED4.

The output of comparator U2A is delivered to the input of a timer U3A. This is a 45 minute modified power up one shot timer. The reset terminal U3A-1 is connected through a resistor R12 to a capacitor C5 and a resistor R13 connected in parallel with the capacitor to the regulated supply Vcc. A diode D4 joins the terminal U3A-1 to the input of the timer. A diode D5 is connected to capacitor C5 and to ground.

A similar timer U3B has its input connected to the output of comparator U2B. The reset terminal U3B-13 is connected through a resistor R14 to a capacitor C6 and a parallel resistor R15, both of which are connected to the regulated supply voltage. A diode D6 joins reset terminal U3B-13 to the timer input. A further diode D7 is connected from ground to the capacitor C6.

The output of timer U3A is connected through a resistor R16 to a green light emitting diode LED5 and through a resistor R17 to a yellow light emitting diode LED6. The green diode is grounded while the other sided of yellow diode leads to the output of the second timer. The output of timer U3B is also connected through a resistor R18 to the base of a transistor Q2. The emitter of the transistor is grounded, while the collector leads to a capacitor C7, the other side of which is grounded and to a voltage divider consisting of resistors R19 and R20. The common point of the voltage divider is connected to the reset terminal of timer U4A, while the collector of the transistor Q2 is also connected to the timer input. The output of timer U4A is connected through a resistor R21 to a red light emitting diode LED7, which is in turn connected to the regulated power supply Vcc.

The light emitting diode LED5, LED6 and LED7 serve as the indicators 32, 34 and 36 on the monitor display panel. The yellow and red light emitting diodes LED1 and LED2 are diagnostic indicators, used for calibration purposes as will be discussed more fully in the following.

In use, when the comparator U2A detects a battery voltage above its set threshold, its output will go low. This triggers the output of timer U3A to go high. The capacitor C5 charges. Charge is maintained by diode D4 and the low output of comparator U2A. When comparator U2A detects a battery voltage below the preset threshold, its output goes high and timer U3A is allowed to time. If the monitored voltage remains below threshold for 45 minutes, the output of the timer will go low. As mentioned in the foregoing, battery voltage drops under load such as travel and lift operations. Between lift operations, battery voltage restores. If the battery is not discharged sufficiently, the restoration of the battery voltage will cause it to rise above the threshold of comparator U2A, causing the comparator output to go low. This will recharge capacitor C5 through diode D4 before time out appears. This resets the timer U3A to zero time.

The timer U3B operates in the same way as timer U3A.

The outputs of timers U3A and U3B control the green, yellow and red display LED5, LED 6 and LED7. U4A is an astable timer that flashes the red LED7 on and off every half second. When the output of timer U3B is high, transistor Q2 is turned on, capacitor C7 remains discharged and the input to timer U4A is low. This inhibits U4A from cycling. Its output then remains high and LED7 remains off.

Starting with a fully charged battery, the U3A output will be high, illuminating the green LED5. The U3B output will be high so that the yellow LED 6 will be off. Timer U4A is inhibited and the red LED7 is off. When the battery discharges to below the "Do Not Charge" zone, the output of timer U3A will go low. The green light will go off. The U3B output remains high and the yellow LED 6 will go on. When the battery discharges to the "Must Charge" zone, the output of U3B will go low, U4 will be enabled and the red LED7 will flash.

The system has an audio signal circuit 70. Audio control is performed by a further modified power start up circuit U4B. The modification includes astable operation and two timing sequences.

The primary timing components of the audio signalling circuit include capacitor C8 connected to the regulated supply, a resistor R21 connected to the capacitor and a resistor R22 leading from the resistor R21 to the regulated supply Vet. The junction of resistors R21 and R22 is connected to a reset terminal of U4B through a resistor R23. A diode D8 connects the capacitor C8 to ground.

Secondary timing is an extension of the primary timing. This is controlled by capacitor C9 joined to the common point of resistors R21 and R22. The capacitor C9 is connected to a diode D9 and to the collector of a transistor Q3. The base of the transistor is connected through a resistor R24 to the output of timer U3B.

The output of U4B is connected to a piezo alarm 72 which is in turn connected to a wiper of the trimpot RP4 through a diode D10. The trimpot acts as a volume control for the piezo alarm. The diode D10 ensures alarm silence when the volume control is turned fully down.

The output of timer U3A is connected through a resistor R25 to the base of a transistor Q4. The transistor collector is connected to the input of circuit U4B. When the output of U3A is high, the transistor Q4 is on and U4B will be inhibited.

When the output of U3A goes low, U4B is enabled. With the output of U3B high, capacitor C9 is switched into the circuit to extend the time constant of the system. When the output of U3B goes low, transistor Q3 turns off and capacitor C8 times the circuit.

Where desired, the audio signal for the OK To Charge phase may be disabled with switch SW2 which will connect the high output of U3B to the transistor Q4 to inhibit U4B until the output of U3B goes low.

The circuit also includes a lift lock out circuit 74. This is based on a comparator U2D. Two resistors, R26 connected to ground and R27 connected to Vcc, provide threshold bias to the comparator. A resistor R28 provides a small amount of hysteresis. The sensor terminal of comparator U2D is connected to a capacitor C10 also connected to regulated supply Vcc in parallel with a resistor R29. The U2D sensor input is also connected to the collector of a transistor Q5 with its base connected through a resistor R30 to the output of the timer U3B, and its emitter grounded.

The output of the comparator U2D is connected to a relay coil K1 which is connected in parallel with a diode D11. The relay contacts K1-2 and K1-3 are normally open and are connected in the lift motor circuit. A capacitor C11 and a voltage regulator VR2 bridge the contacts 2 and 3. A by-pass switch SW3 may be used to by-pass the lock out feature.

If the battery condition is above the "Must Charge" level, the output of U3B will be high and the transistor Q5 will be on, thus charging capacitor C10. The output of U2D will go high and the relay K1 will energize to close its contacts K1-2 and K1-3, enabling the operation of the lift motor. When the output timer U3B goes low, transistor Q5 turns off, and the capacitor C10 will discharge. The output of comparator U2D will go low after ten minutes, de-energizing relay K1 and locking out the lift motor. The additional time is allowed to permit the completion of an operation under way when the red light goes on.

Over voltage protection is provided by a circuit 76. The over voltage protection includes a transistor Q6 with its base connected to the output of the voltage selector 62. The collector is connected to the regulated voltage supply Vcc through a resistor R31 while its emitter is connected to ground through the capacitor C12 and to the base of transistor Q7 through a diode D12. A resistor R32 connects the base of transistor Q7 to ground. The emitter of the transistor Q7 is grounded, while its collector is connected through a resistor R33 to a point between the battery fault light emitting diodes LED3 and LED4. The diode D12 and the base emitter junction of transistor Q6 and Q7 provide over voltage protection for the sensitive inputs of the comparators U2A, U2B, U2C. This circuit limits the voltage to approximately 8.8 volts at the trimpots RP1 and RP2. The transistor Q7 turns on LED4, lighting half of the battery fault display.

The switching regulator 60 includes an input filter capacitor C16 that is charged by diode D1. The regulator consists of integrated circuit U1 and associated circuitry. The transistors Q8 and Q9 and the diode D13 provide a simple regulated supply for the integrated circuit U1. Regulated output is about 8.8 volts. The transistors Q10 and Q11 provide a current limiting circuit. The resistor R34 is a small (1 ohm) resistor used for current sensing. Transistor Q12 is the switching transistor. Transistors Q13 and Q14 are the switching transistor drivers. Diodes D14 and D15 are speed up diodes, while capacitor C15 connected to the emitter of driver Q14 is a speed up capacitor. Inductance L3 is a ringing coil and the capacitor C16 serves as an output filter. The diode D16 in the feedback circuit provides output sensing and also provides AC feedback to the integrated circuit U1 to reduce output ripple.

The battery monitor thus described has an automatic self testing characteristic. This is accomplished at initial turn on with a charged battery. At turn on, all of the circuit components start from an initial state. On turning on the system, timers U3A and U3B and U4A all have low outputs. The green LED5 and yellow LED6 are off. Sensing voltage is low so the red LED7 will be flashing and the battery fault lights LED3 and LED4 will be on. The capacitor C10 of the lift lock out circuit is uncharged and the relay K1 is de-energized, locking out the lift motor. The capacitor C4 is uncharged so that the sensing voltage is at zero. On start up astable U4B activates the piezo alarm briefly. As capacitor C4 charges the sensor voltage increases. When the voltage level at R1 exceeds the threshold level of U2C, the battery fault lights turn off. As the sensing voltage at C4 continues to increase, the voltage at the wiper of trimpot RP2 will exceed the threshold of comparator U2B. The output of the comparator will go low, causing the output of timer U3B to go high. This turns on the yellow display LED6 and inhibits astable U4A which turns off the red display LED7. At this time capacitor C10 is charged by transistor Q5 and comparator U2 de-energizes the relay K1 enabling lift operation.

As the sensing voltage continues to increase, the voltage at the wiper of trimpot RP1 exceeds the threshold of the comparator U2A. The output of the comparator goes low and the output of the timer U3A goes high. This turns on the green display LED5 and turns off the yellow display LED6.

On completion of the self test, all circuits have been exercised with the exception of the over voltage circuit.

The same system that is used for self testing also provides for auto level recognition. If the battery is not fully charged, for example if the battery is in an OK To Charge condition, the self test sequence will stop at the OK To Charge level. This provides an automatic recognition of the charge state of the battery on start up.

When the battery power is removed from the monitor, the monitor is powered down. Various capacitors are discharged. Capacitor C4 is discharged through trimpots RP1 and RP2 and resistor R1. Capacitor C5 is discharged through diode D5 and the regulated supply Vcc. Capacitor C6 is discharged through diode D6 and regulated supply Vcc. Capacitor C8 is discharged through diode D8. Capacitor C10 is discharged through the collector base junction of transistor Q5, LED6 and LED5. Thus, the entire circuit starts from zero when the monitor is repowered. This prevents a loop failure that might otherwise be caused by unplugging and reconnecting of the battery to extend operations beyond maximum levels of discharge.

The yellow LED 1 and red LED2 associated with the comparators U2A and U2B are used for calibration and adjustment. Not all battery working conditions are the same. Batteries used in different work environments will have significantly different "charge to work cycle" ratios. To accommodate different work loads, the sensing circuitry described in the foregoing may be adjusted through a range of specific gravity points in both the OK To Charge and the Must Charge ranges. The adjustment trimpots RP1 and RP2 are used for this purpose. Because the yellow LED1 and red LED2 are located before the display activating circuitry, these LEDs will turn on the instant the correct voltage is reached. The corresponding light on the display will turn on when the corresponding timer has clocked out. These light emitting diodes allow adjustments to be made quickly and accurately when a reference voltage is used. The calibration jack 52 provides for the connection of a calibrator to the system for this purpose.

While one embodiment of the present invention has been described in the foregoing, it is to be understood that other embodiments are possible within the scope of the invention. For example, the system described is a multi-voltage system that can be adjusted for use with battery systems of different voltages. Single voltage systems may also be constructed within the scope of the invention. The invention has been described in connection with its use with lift trucks. It is to be understood that many other applications are possible. In many of these, the lift lock out may be omitted as an unnecessary feature. It is also to be understood that the terms "Do Not Charge", "OK To Charge" and "Must Charge" are used as descriptive terms. Other language describing the conditions and signals represented may be used on the monitor display 30.

The invention is therefore to be considered limited solely by the scope of the appended claims.

We claim:

1. A method of monitoring the charge on an electric storage battery having two terminals with a voltage across the terminals, said method comprising:
    monitoring the voltage across the terminals of the battery;
    producing a Do Not Charge signal whenever the monitored voltage exceeds a first predetermined voltage;
    maintaining the Do Not Charge signal until the monitored voltage falls below the first predetermined voltage for a period longer than a first predetermined period, then eliminating the Do Not Charge signal and producing an OK To Charge signal; and
    maintaining the OK To Charge signal until the monitored voltage falls below a second predetermined voltage less than the first predetermined voltage for a period longer than a second predetermined period, then eliminating the OK To Charge signal and producing a Must Charge signal.

2. A method according to claim 1 including producing a battery fault signal when the monitored voltage falls below a third predetermined voltage, less than the second predetermined voltage.

3. A method according to claim 2 including producing an over voltage signal when the monitored voltage exceeds a fourth predetermined voltage, greater than the first predetermined voltage.

4. A battery monitor for monitoring the charge of a rechargeable electric storage battery having two terminals and a terminal voltage that is variable with battery charge and loads applied to the battery, the terminal voltage rising to a steady state counter voltage representing the battery charge over a recovery time interval after electrical loads are removed from the battery, said monitor comprising:
    means for monitoring the terminal voltage;
    first comparator means for comparing the monitored terminal voltage with a first predetermined value;
    second comparator means for comparing the monitored terminal voltage with a second predetermined value less than the first predetermined value;
    first indicator means for providing a Do Not Charge signal;
    second indicator means for displaying an OK To Charge signal;
    third indicator means for providing a Must Charge signal;
    first time delay means connected to the first comparator means and to the first and second indicator means for maintaining the Do Not Charge signal and preventing the production of the OK To Charge signal until the monitored voltage of the battery has remained less than the first predetermined value for a first predetermined duration;
    second time delay means connected to the second comparator means and to the second and third indicator means for maintaining the OK To Charge signal and preventing the production of the Must Charge signal until the monitored battery voltage has remained less than the second predetermined value for a second predetermined duration.

5. A monitor according to claim 4 wherein the signals comprise visual signals.

6. A monitor according to claim 5 wherein the indicator means comprise lights and the means for illuminating lights to display the respective signals.

7. A monitor according to claim 6 wherein the Do Not Charge signal comprises a light of a green color, the OK To Charge signal comprises a light of a yellow color and the Must Charge signal comprises a light of a red color.

8. A monitor according to claim 5 wherein the Must Charge signal is an intermittent signal.

9. A monitor according to claim 5 wherein the Must Charge signal includes a audible Must Charge alarm.

10. A monitor according to claim 9 wherein the OK To Charge signal includes an audible OK To Charge signal, audibly different from the audible Must Charge alarm.

11. A monitor according to claim 4 including calibration means comprising first calibration indicator means providing an OK To Charge calibration signal at all times that the value of the monitored battery voltage is between the first and second predetermined values and second calibration indicator means for providing a Must Charge calibration signal at all times that the value of the monitored battery voltage is less than the second predetermined value.

12. A monitor according to claim 11 wherein the calibration means include means for supplying calibrating signals of predetermined voltages to the monitoring means.

13. A monitor according to claim 4 including third comparator comparing the monitored battery voltage with a third predetermined voltage less than the second predetermined voltage and battery fault display means for displaying a Battery Fault signal whenever the monitored voltage is less than the third predetermined voltage.

14. A monitor according to claim 4 including over voltage protection means connected, to the monitoring means for limiting voltages applied to the comparator means from the monitoring means.

15. A monitor according to claim 14 including over voltage signal means for signalling the receipt by the monitoring means of a voltage in excess of a predetermined maximum voltage.

16. A monitor according to claim 4 including lockout means for locking out an electric circuit, said lockout means comprising normally open switch means in the electric circuit, means for closing the normally open switch means in the absence of a Must Charge signal and third time delay means for allowing the switch means to open a third predetermined duration after the Must Charge signal is first produced.

17. A battery monitor for an electric storage battery comprising:
   battery condition monitor means;
   electrical connection means for electrically connecting the battery condition monitor means to the battery for generating a battery signal representing the battery charge;
   battery condition display means connected to the battery condition monitor means for receiving the battery signal, the display means including a plurality of indicator means having respective initial states, the respective indicator means being operable in response to different levels of the battery signal to produce respective indications of the battery charge;
   means responsive to disengagement of the electrical connection means for electrically disconnecting the battery condition monitor means from the battery for returning each indicator means to its initial state;
   means responsive to engagement of the electrical connection means for electrically connecting the battery condition monitor means to the battery for varying the level of the battery signal from a level representing minimum battery charge to a level representing full battery charge, thereby operating the indicator means in sequence until the indicator means produce a signal representing the actual battery charge.

18. A battery monitor according to claim 17 wherein the battery condition signal comprises a voltage signal.

19. A monitor according to claim 17 in combination with an electric circuit, the electric circuit having a normally open switch means therein, means for closing said switch means in response to a battery signal representing a predetermined minimum battery charge.

* * * * *